US010355678B2

(12) United States Patent
Ye et al.

(10) Patent No.: US 10,355,678 B2
(45) Date of Patent: Jul. 16, 2019

(54) HIGH-EFFICIENCY FREQUENCY DOUBLER WITH A COMPENSATED TRANSFORMER-BASED INPUT BALUN

(71) Applicant: The Regents of the University of California, Oakland, CA (US)

(72) Inventors: Yu Ye, Davis, CA (US); Adrian J. Tang, Ontario (CA); Qun Gu, Davis, CA (US); Brian J. Drouin, Pasadena, CA (US)

(73) Assignees: The Regents of the University of California, Oakland, CA (US); California Institute of Technology, Pasadena, CA (US)

( * ) Notice: Subject to any disclaimer, the term of this patent is extended or adjusted under 35 U.S.C. 154(b) by 86 days.

(21) Appl. No.: 15/826,195

(22) Filed: Nov. 29, 2017

(65) Prior Publication Data
US 2018/0159516 A1 Jun. 7, 2018

Related U.S. Application Data

(60) Provisional application No. 62/430,109, filed on Dec. 5, 2016.

(51) Int. Cl.
| *H03K 5/00* | (2006.01) |
| *H03H 11/30* | (2006.01) |
| *H03H 11/32* | (2006.01) |
| *H03B 19/14* | (2006.01) |
| *H03H 7/42* | (2006.01) |

(52) U.S. Cl.
CPC ......... *H03K 5/00006* (2013.01); *H03B 19/14* (2013.01); *H03H 11/30* (2013.01); *H03H 11/32* (2013.01); *H03B 2200/009* (2013.01); *H03H 7/42* (2013.01)

(58) Field of Classification Search
None
See application file for complete search history.

(56) References Cited

U.S. PATENT DOCUMENTS

| 5,194,820 | A | * | 3/1993 | Besson | ................... | H03B 19/14 327/122 |
| 5,826,183 | A | * | 10/1998 | Apel | ...................... | H03B 19/14 455/326 |
| 2003/0119473 | A1 | * | 6/2003 | Smith | .................. | H03D 7/1441 455/326 |

* cited by examiner

*Primary Examiner* — Jeffery S Zweizig
(74) *Attorney, Agent, or Firm* — Park, Vaughan, Fleming & Dowler LLP

(57) ABSTRACT

The disclosed embodiments relate to the design of a high-speed frequency doubler circuit. During operation, the circuit uses a transformer-based balun to convert a single-ended input signal into a differential signal, wherein the transformer-based balun includes a transformer with a primary coil, which receives the single-ended input signal, and a secondary coil, which produces the differential signal. The transformer also includes a central compensation capacitor coupled between a center tap of the secondary coil and ground, wherein the central compensation capacitor acts to suppress common-mode components in the differential signal. Next, the circuit uses a pseudo-differential amplifier to convert the differential signal into a single-ended output signal, which has double the frequency of the single-ended input signal.

18 Claims, 9 Drawing Sheets

FREQUENCY DOUBLER CIRCUIT 100

HIGH-EFFICIENCY FREQUENCY DOUBLER WITH A COMPENSATED TRANSFORMER-BASED INPUT BALUN

CROSS-REFERENCE TO RELATED APPLICATION

This application claims the benefit of U.S. Provisional Patent Application Ser. No. 62/430,109, entitled "Broadband High Frequency Doubler with a Compensated Transformer-Based Balun," by inventors Yu Ye, Arian J. Tang, Qun Gu and Brian J. Drouin, filed on 5 Dec. 2016, the contents of which are incorporated by reference herein.

GOVERNMENT LICENSE RIGHTS

This invention was made with U.S. government support in the performance of work under NASA contract NNN12AA01C, and is subject to the provisions of Public Law 96-517 (35 USC 202) in which the Contractor has elected to retain title. The U.S. government has certain rights in the invention.

BACKGROUND

Field

The disclosed embodiments generally relate to the design of a frequency doubler circuit. More specifically, the disclosed embodiments relate to the design of a frequency doubler circuit having a transformer-based input balun that uses a central compensation capacitor to facilitate balanced performance and input matching.

Related Art

The growing interest in millimeter wave systems in recent years has been driving the development of associated high-frequency circuits. A fundamental challenge in building such millimeter wave systems is to provide a high-speed frequency generator, such as voltage-controlled oscillator, with a wide tuning range and acceptable phase noise. A broadband frequency multiplier, which provides high efficiency and high output power, can help to generate such high frequencies. However, existing frequency multipliers generally do not operate well at extremely high frequencies above 60 GHz. Also, most frequency multiplier designs can only operate within a limited operating frequency range, thus being unsuitable for applications, such as 5G wireless systems, which require a wide range of operating frequencies.

Hence, what is needed is a frequency multiplier circuit that operates effectively at very high frequencies, and also provides the flexibility to operate across a wide range of operating frequencies.

SUMMARY

The disclosed embodiments relate to the design of a high-speed frequency doubler circuit. During operation, the circuit uses a transformer-based balun to convert a single-ended input signal into a differential signal, wherein the transformer-based balun includes a transformer with a primary coil, which receives the single-ended input signal, and a secondary coil, which produces the differential signal. The transformer also includes a central compensation capacitor coupled between a center tap of the secondary coil and ground, wherein the central compensation capacitor acts to suppress common-mode components in the differential signal. Next, the circuit uses a pseudo-differential amplifier to convert the differential signal into a single-ended output signal, which has double the frequency of the single-ended input signal.

In some embodiments, the central compensation capacitor is sized to ensure that the frequency doubler circuit provides a flat response over a target range of operating frequencies.

In some embodiments, the pseudo-differential amplifier doubles the frequency of the differential input signal by cancelling a fundamental frequency of the differential signal and extracting a second-order harmonic to produce the single-ended output signal.

In some embodiments, the differential signal comprises two complementary signals $S_1$ and $S_2$, and the pseudo-differential amplifier is implemented using two transistors $M_1$ and $M_2$, wherein the gate of $M_1$ is coupled to $S_1$, and the gate of $M_2$ is coupled to $S_2$. Also, the drains of $M_1$ and $M_2$ are coupled to ground, and the sources of $M_1$ and $M_2$ are combined at a common node, which is coupled to the frequency-doubler output through a set of output-matching elements.

In some embodiments, a bias circuit is used to provide a bias voltage for the gates of transistors $M_1$ and $M_2$. This bias circuit includes: a bias input, which receives a bias voltage $V_b$; a bias bypass capacitor, coupled between the bias input and ground; and a conductor, which couples the bias input to the center tap of the secondary coil.

In some embodiments, the set of output-matching elements includes filtering elements, which filter out a fundamental frequency of the input signal. These filtering elements include: a filtering inductor, with a first terminal coupled to the common node and a second terminal coupled to $V_{DD}$; and a filtering bypass capacitor, coupled between the second terminal of the filtering inductor and ground.

In some embodiments, the set of output-matching elements includes impedance-matching elements, which match an impedance of the output signal with an impedance of an output load. These impedance-matching elements include: an impedance-matching inductor, with a first terminal coupled to the common node; and an impedance-matching capacitor, coupled between a second terminal of the impedance-matching inductor and the frequency-doubler output.

In some embodiments, the circuit also includes: a first input-matching micro-strip transmission line $TL_1$, which carries the differential signal $S_1$ from the transformer to the gate of transistor $M_1$; and a second input-matching micro-strip transmission line $TL_2$, which carries the differential signal $S_2$ from the transformer to the gate of transistor $M_2$.

In some embodiments, the frequency doubler circuit is fabricated on a complementary metal oxide semiconductor (CMOS) chip.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Implementation

Figure 1:
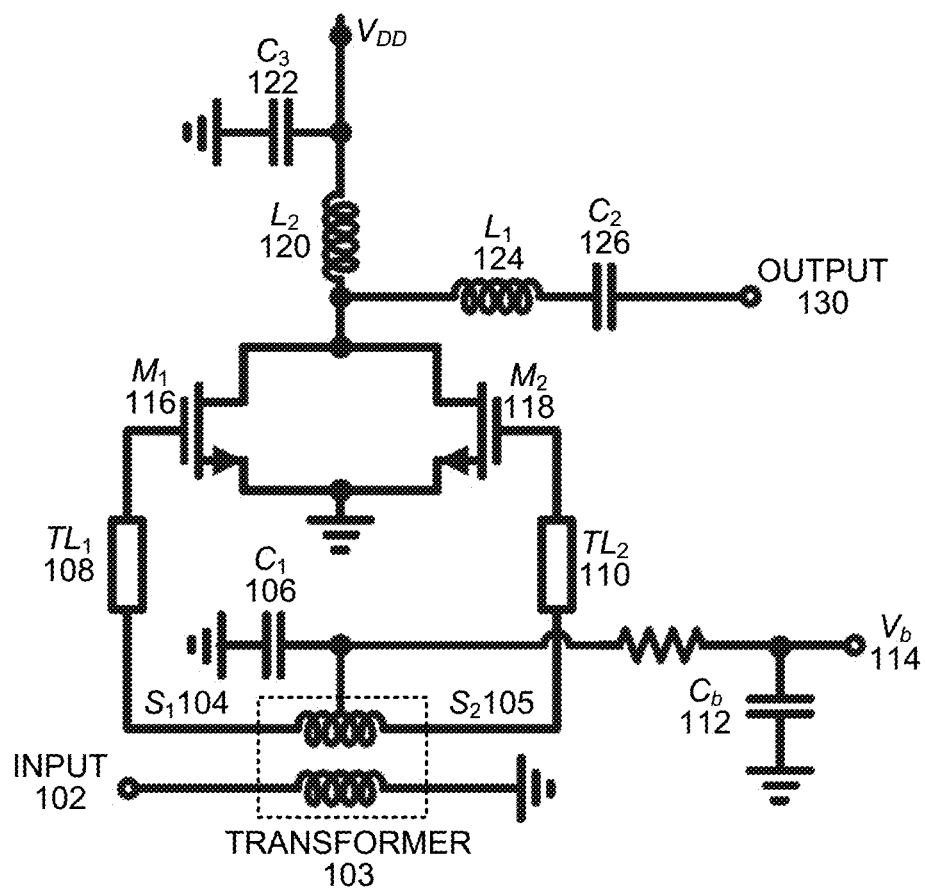
FIG. 1 illustrates the topology of a push-push frequency doubler circuit with a central compensation capacitor in accordance with the disclosed embodiments.

The disclosed embodiments relate to a frequency doubler circuit, which is designed for a bulk 65 nm CMOS process. FIG. 1 depicts the topology of the frequency doubler circuit 100. The input 102 receives a single-ended signal, which is converted into a pair of differential signals $S_1$ 104 and $S_2$ 105 by an input transformer 103, wherein a compensation capacitor $C_1$ 106 is coupled to the center tap of the secondary coil of transformer 103. Note that $TL_1$ 108 and $TL_2$ 110 are input matching micro-strip transmission lines. The differential signals $S_1$ and $S_2$ feed into a pseudo-differential amplifier, formed by transistors $M_1$ 116 and $M_2$ 118. The gate width of each of the transistors $M_1$ 116 and $M_2$ 118 is 24 µm. The drains of transistors $M_1$ 116 and $M_2$ 118 are combined, whereby the fundamental signal is cancelled and the second order harmonic is extracted. Inductors $L_1$ 120, $L_2$ 124 and the capacitor $C_2$ 126 comprise output-matching elements, which are used to produce an output 104, which can be used to generate a signal that is transmitted through an antenna (not shown). Capacitors $C_3$ 122 and $C_{b\ 112}$ are the bypass capacitors.

Figure 2:
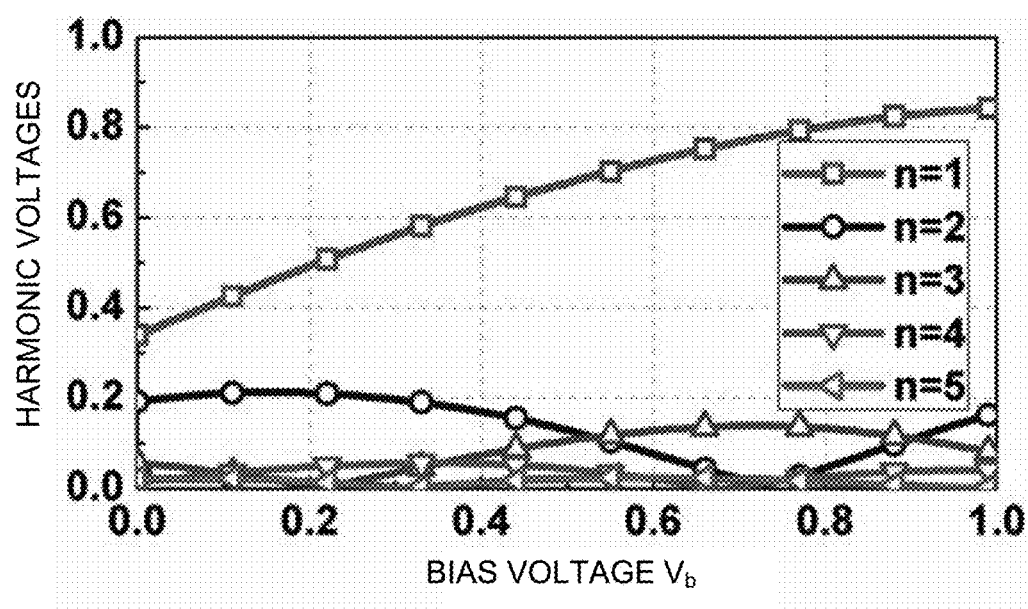
FIG. 2 illustrates simulated harmonic output voltages as a function of gate bias voltage for the frequency doubler circuit in accordance with the disclosed embodiments.

The transistor nonlinearity for generating different harmonics is determined by the gate bias for transistors $M_1$ 116 and $M_2$ 118. As shown in FIG. 2, the optimum bias range is from 0.15 V to 0.2 V, while the $V_{th}$ of the transistor is 0.21 V. Moreover, at this gate bias range, the power of third, fourth and fifth harmonics is low, which facilitates high-order harmonic rejection.

Marchand baluns are widely used in broadband circuits. However, the two coupled lines in a conventional Marchand balun are not identical and cause large mismatches between the converted signals. Some modified Marchand baluns with compensated capacitors have been proposed to improve performance. However, Marchand baluns are inherently narrow band.

Figure 3A:
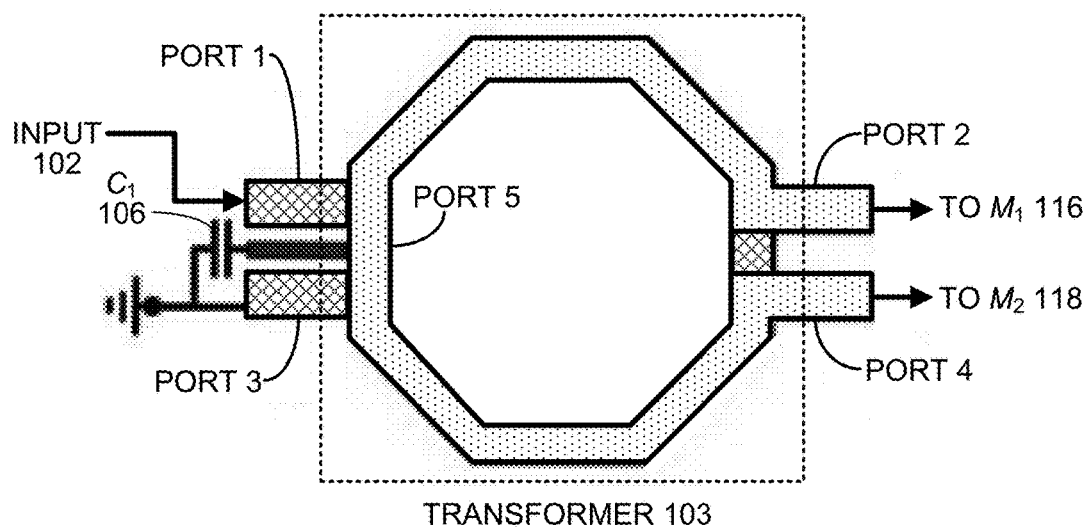
FIG. 3A illustrates the layout of a transformer-based balun with the central compensation capacitor in accordance with the disclosed embodiments.
Figure 3B:
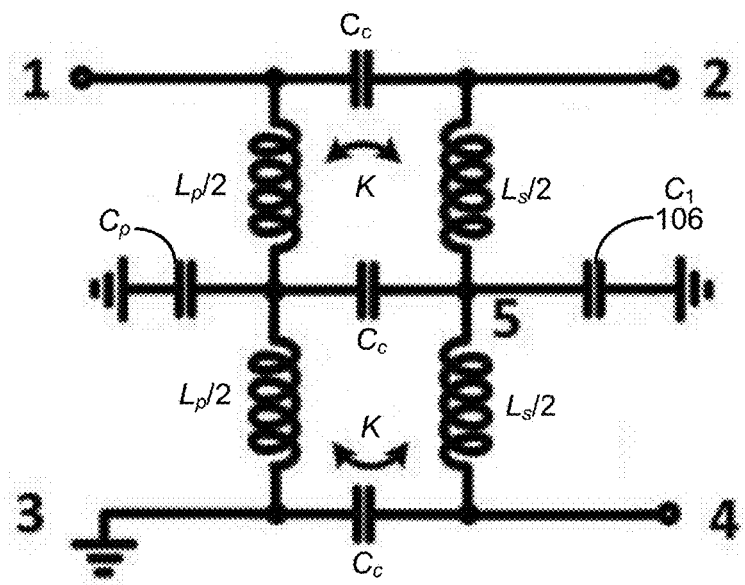
FIG. 3B illustrates an equivalent circuit for the transformer-based balun illustrated in FIG. 3A in accordance with the disclosed embodiments.
Figure 4A:
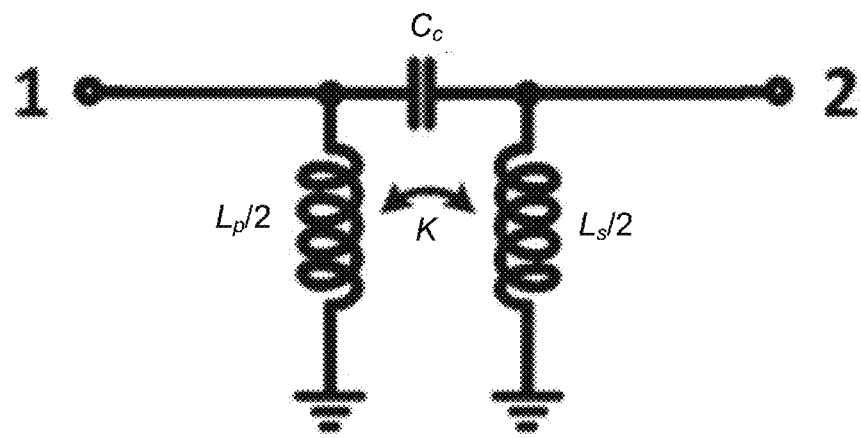
FIG. 4A illustrates an odd-mode equivalent half circuit for the transformer-based balun in accordance with the disclosed embodiments.
Figure 4B:
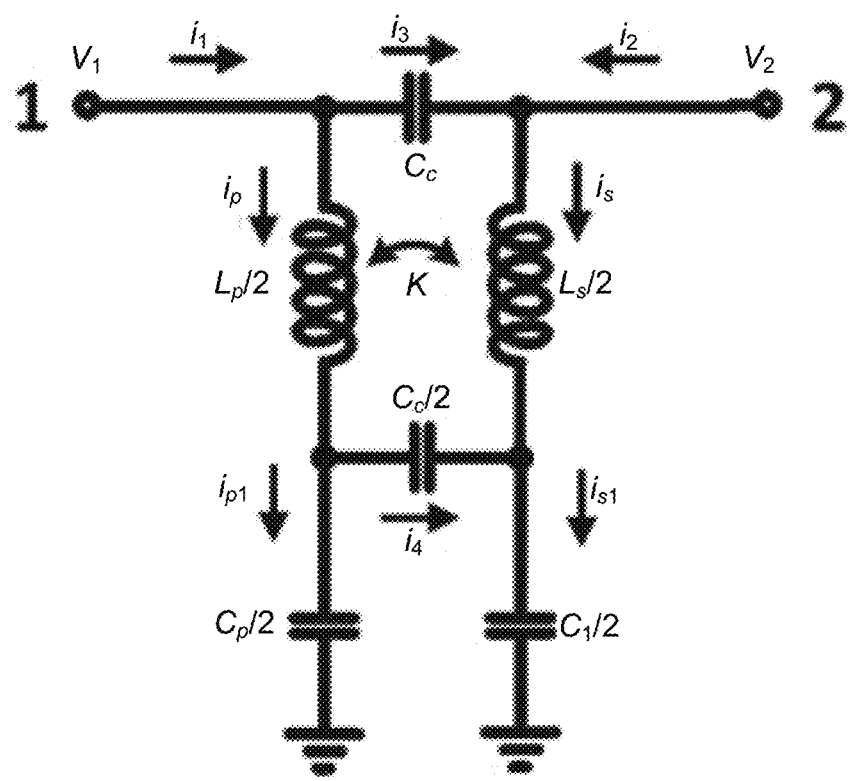
FIG. 4B illustrates an even-mode equivalent half circuit for the transformer-based balun in accordance with the disclosed embodiments.

To achieve such wideband performance with compact and symmetrical features, the disclosed embodiments provide a new transformer-based balun design with a central compensation capacitor $C_1$ 106 to produce balanced outputs as illustrated in FIGS. 3A-3B. Note that the compensation capacitor $C_1$ 106 is bypassed in the center (at port 5) between the balanced ports 2 and 4. The transformer has individual winding inductances of $L_p$ (for the primary coil) and $L_s$ (for the secondary coil) with a coupling factor of K. $C_p$ and $C_c$ are the parasitic capacitances. The transformer can be analyzed by the even-mode and odd-mode technique as shown in FIGS. 4A-4B. Note that compensation capacitor $C_1$ 106 does not affect the odd-mode equivalent circuit illustrated in FIG. 4A. In contrast, for the even-mode equivalent circuit illustrated in FIG. 4B, the compensation capacitor $C_1$ 106 can help the transformer to mitigate the unwanted common-mode signal caused by the single-ended input signal. To minimize the common-mode signal at the balanced ports 2 and 4, the signal should not pass from port 1 to port 2 in the even-mode circuit illustrated in FIG. 4B. This can be expressed by the following equation $$S_{21}^e \quad (1)$$

where $S_{21}^e$ is the S-parameter of the even-mode of the four-port network. Extrapolating from FIG. 4B, the terminal equations can be expressed as $$V_1 = i_p(j\omega L_p/2) + i_s(j\omega M/2) + i_{p1}(2/j\omega C_p) \quad (2)$$

$$V_2 = i_s(j\omega L_s/2) + i_p(j\omega M/2) + i_{s1}(2/j\omega C_1) \quad (3)$$

$$i_{p1}(2/j\omega C_p) - i_{s1}(2/j\omega C_1) = i_4(2/j\omega C_c) \quad (4)$$

where M is the mutual inductance between $L_p$ and $L_s$, which can be represented as $M = k(L_s L_p)^{1/2}$. To achieve Eq. (1), compensation capacitor $C_1$ 106 needs to satisfy the following equation.

$$C_1 = \frac{4}{\omega^2 L_s} \cdot \frac{-4 + \omega^2 L_p C_p + \omega^2 C_c(L_p + L_s - k\sqrt{L_p L_s}) - (1-k^2)\omega^4 L_p L_s C_p C_c}{(1-k^2)\omega^2 L_p (C_p + C_c) - 4} \quad (5)$$

Figure 5:
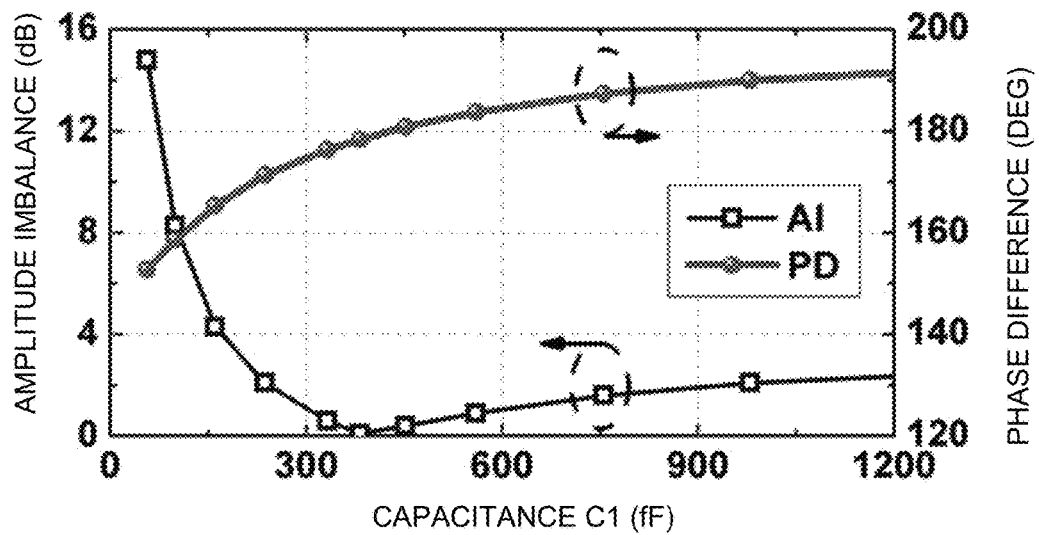
FIG. 5 illustrates a simulated amplitude imbalance (AI) and a simulated phase difference (PD) versus the capacitance of the compensation capacitor at 45 GHz in accordance with the disclosed embodiments.
Figure 6:
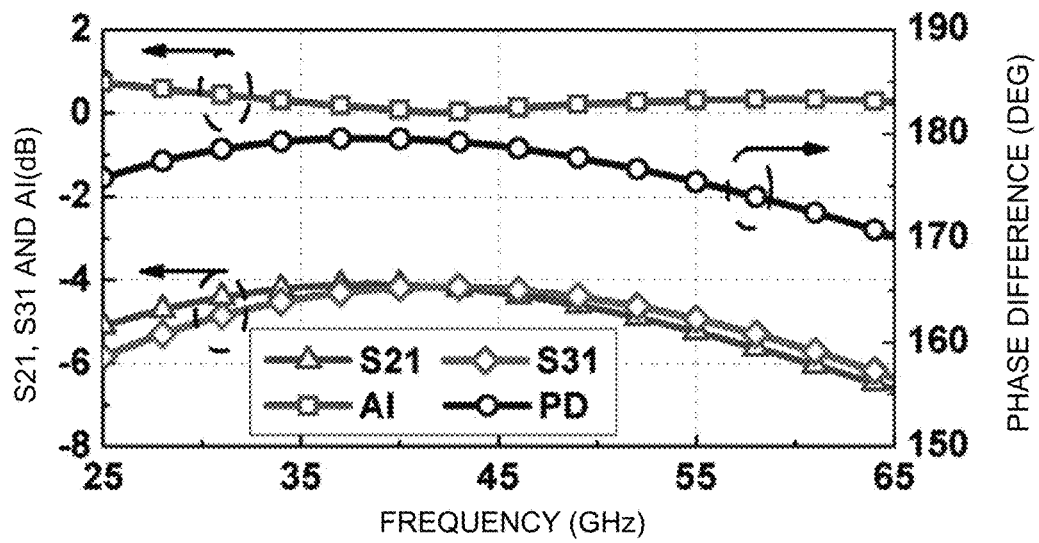
FIG. 6 illustrates simulated $S_{21}$, $S_{31}$, AI and PD values for the transformer-based balun in accordance with the disclosed embodiments.

Note that the transformer 103 is implemented using metal layers 5 and 6 to enhance coupling. The width of the metal line is 8 μm and the inner diameter is 68 μm. The values of $L_p$ and $L_s$ are 160 pH and 152 pH, respectively. The coupling factor k is 0.798 and the parasitic capacitances $C_p$ and $C_c$ are 8 fF and 6 fF, respectively. As shown in FIG. 5, the amplitude imbalance (AI) and phase difference (PD) can be adjusted by using different values of $C_1$. In this design, a metal-oxide-metal (MOM) capacitor with capacitance of 382 fF and Q-factor of approximately 20 at 45 GHz is used after a post-layout simulation optimization. The simulated AI and PD of the compact balun are illustrated in FIG. 6. Note that the insertion loss for each balanced port is less than 2 dB from 30 to 50 GHz, with an AI of less than 0.5 dB and a PD of 178°±1.5°, respectively.

Measurement Results

A frequency doubler circuit was fabricated with the dimensions of 0.6×0.45 mm² including the pads. All the measurements were tested via on-wafer probing. The input signal was generated by signal generator (Agilent E8257D). The output signal was analyzed by power meter (HP 438A) with power sensors (Agilent W8486A and Anristu MP716A). A down-converted output signal (Agilent 11970 W) was analyzed using an Agilent PXA N9030A. All the losses of probes, cables, and waveguides were calibrated by using the Agilent N5247A PNA-X vector network analyzer.

Figure 7:
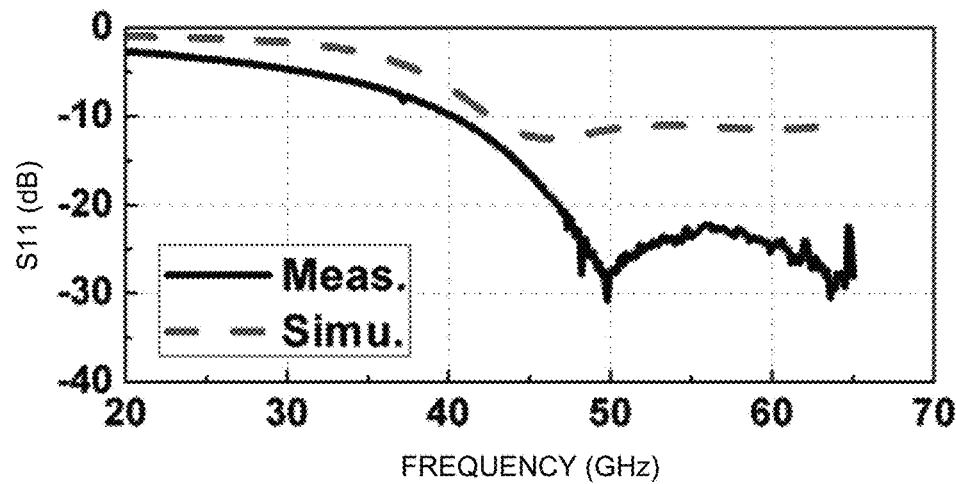
FIG. 7 illustrates both simulated and measured $S_{11}$ values for the frequency doubler circuit in accordance with the disclosed embodiments.
Figure 8:
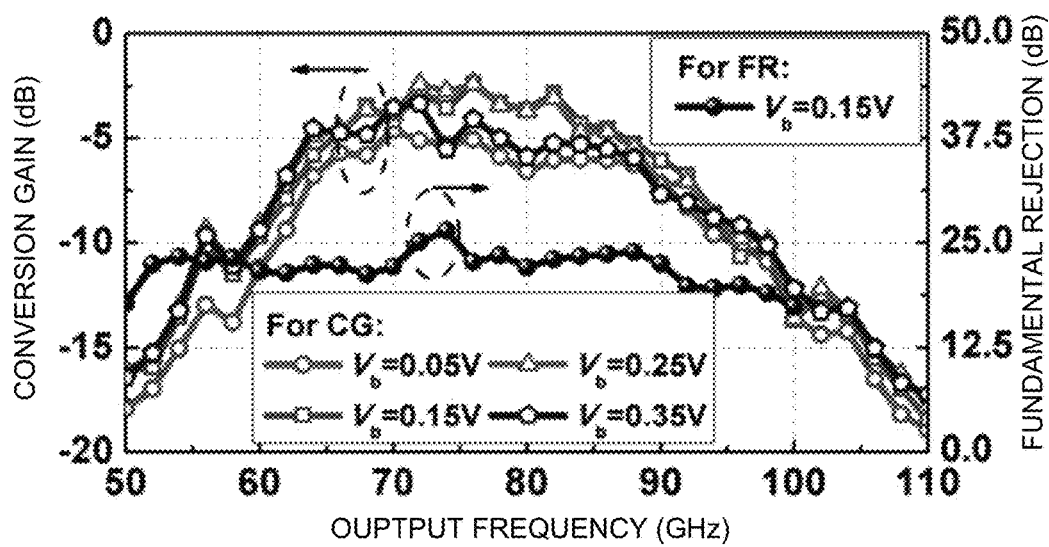
FIG. 8 illustrates measured conversion gain (CG) and measured fundamental rejection (FR) as a function of output frequency at several different compensation voltages for the frequency doubler circuit in accordance with the disclosed embodiments.
Figure 9:
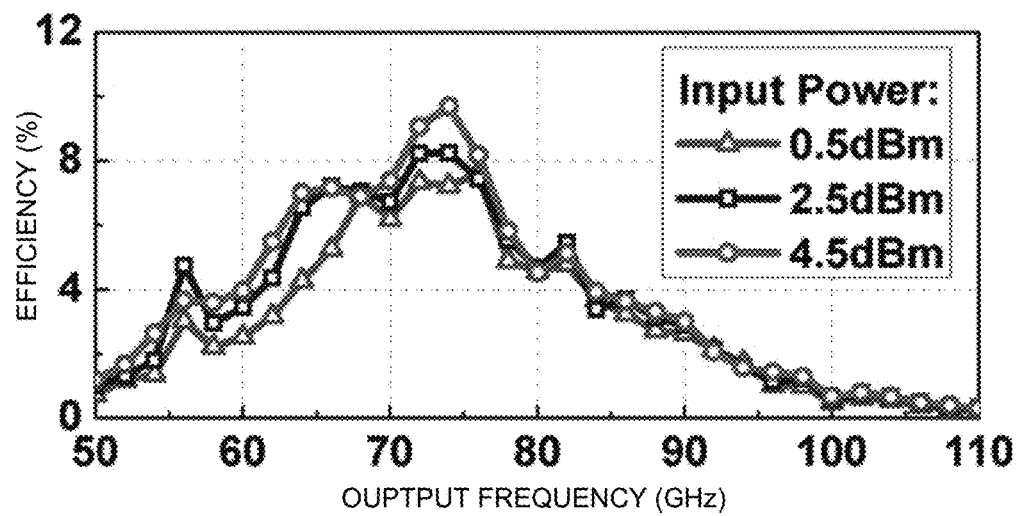
FIG. 9 illustrates measured power efficiency for the frequency doubler circuit for several different input powers in accordance with the disclosed embodiments.

FIG. 7 shows measured input small signal parameters compared with the simulation results. Note that the measured input reflection coefficient ($S_{11}$) is below −10 dB from 40 to 65 GHz, showing a broadband $S_{11}$ behavior, which matches well with the simulation results. FIG. 8 illustrates the measured CG and FR versus frequency at different bias voltages. As shown in FIG. 8, the peak CG for $V_b$=0.15 V is around −2.5 dB from 70 to 80 GHz. The 3 dB bandwidth is 28 GHz from 62 to 90 GHz. The measured FR is better than 20 dB with a peak FR of better than 25 dB at 74 GHz. FIG. 9 shows efficiency versus output frequency at different input powers of 2.5 and 4.5 dBm, respectively. Here the power efficiency is defined as $\eta = P_{out}/(P_{DC}+P_{in})$, wherein $P_{out}$ and $P_{in}$ denote the output and input power at frequencies of $2f_0$ and $f_0$, respectively. The peak efficiency is 9.7% obtained at 74 GHz with 4.5 dBm input power. The efficiency is better than 6% from 62 to 78 GHz.

Figure 10:
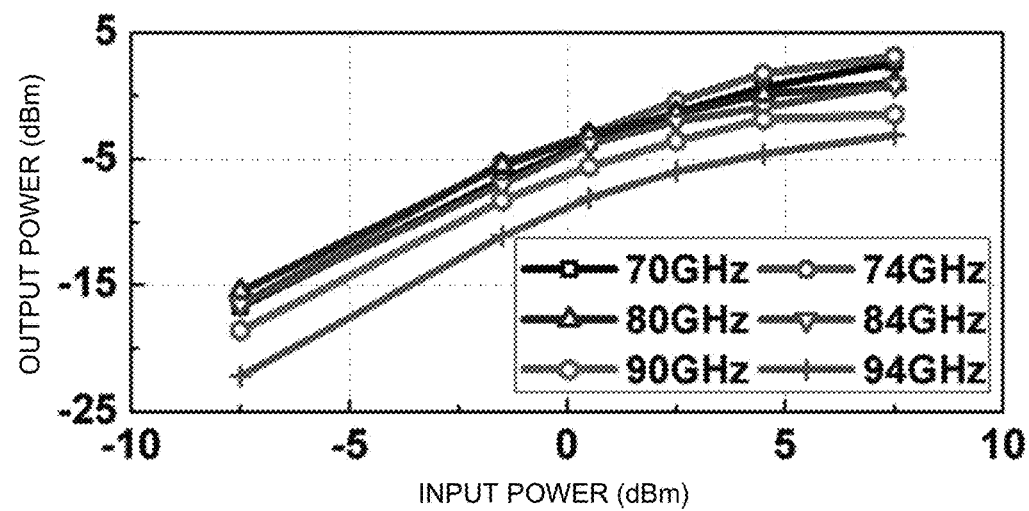
FIG. 10 illustrates measured output power versus input power for the frequency doubler circuit at six different frequencies in accordance with the disclosed embodiments.

FIG. 10 plots the output power versus the input power at different frequencies, respectively. Note that the saturated output power is better than 0 dBm with the peak saturated output power of 2.5 dBm at 74 GHz. At a bias voltage of 0.15 V, the frequency doubler typically draws 12 mA from 1V power supply with 4.5 dBm input power. These measurement results indicate that the phase noise of the doubler is negligible.

Process of Operation

Figure 11:
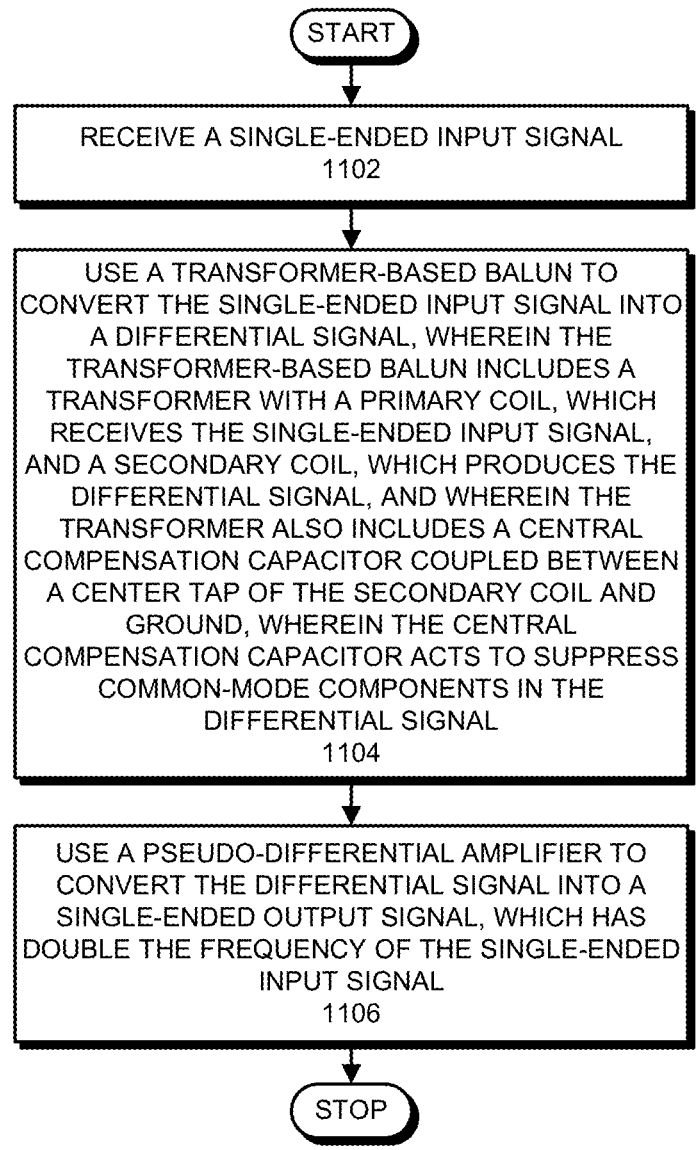
FIG. 11 presents a flow chart illustrating operations performed by the frequency doubler circuit in accordance with the disclosed embodiments.

FIG. 11 presents a flow chart illustrating operations performed by the frequency doubler circuit in accordance with the disclosed embodiments. During operation, the circuit receives a single-ended input signal (step 1102). Next, the circuit uses a transformer-based balun to convert the single-ended input signal into a differential signal, wherein the transformer-based balun includes a transformer with a primary coil, which receives the single-ended input signal, and a secondary coil, which produces the differential signal. The transformer also includes a central compensation capacitor coupled between a center tap of the secondary coil and ground, wherein the central compensation capacitor acts to suppress common-mode components in the differential signal (step 1104). Finally, the circuit uses a pseudo-differential amplifier to convert the differential signal into a single-ended output signal, which has double the frequency of the single-ended input signal (step 1106).

Exemplary Use Case

Figure 12:
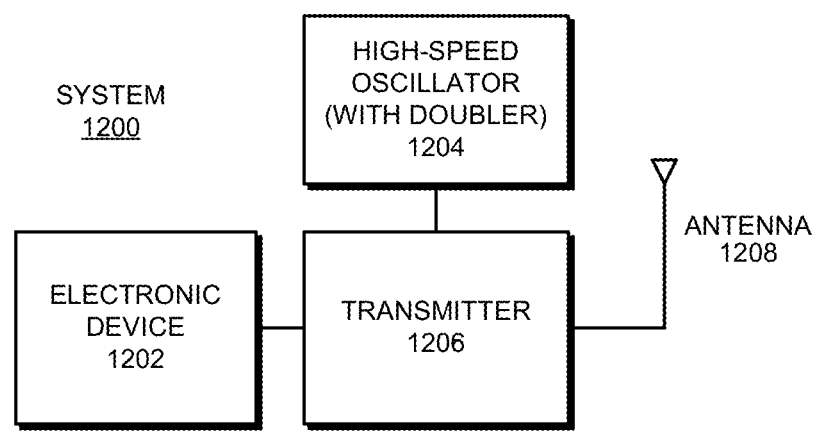
FIG. 12 illustrates an exemplary use case for the doubler circuit in accordance with the disclosed embodiments.

FIG. 12 illustrates an exemplary use case for the doubler circuit in accordance with the disclosed embodiments. In this use case, a system 1200 comprises an electronic device 1202 that is coupled to a transmitter 1206, which transmits a signal through an antenna 1208. During this process, transmitter 1206 makes use of a high-speed oscillator 1204, which includes a frequency doubler, to generate a carrier signal for the transmission. Note that system 1200 can include any type of electronic system, which transmits signals at millimeter wavelengths.

CONCLUSION

The disclosed embodiments provide a broadband, high-efficiency frequency doubler circuit, which is enabled by a novel central-capacitor-based compensation technique that produces balanced signals to achieve good broadband performance. An exemplary implementation of this frequency doubler circuit achieves a saturated output power of 2.5 dBm, a peak CG of −2.5 dB, a peak FR of 25 dB and efficiency of 9.7% at 74 GHz, with a 3 dB CG bandwidth of 28 GHz from 62 to 90 GHz.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A frequency doubler circuit, comprising:
   a frequency-doubler input that receives a single-ended input signal;
   a transformer-based balun coupled to the frequency-doubler input, which converts the single-ended input signal into a differential signal;
   wherein the transformer-based balun includes a transformer with a primary coil, which receives the single-ended input signal, and a secondary coil, which produces the differential signal;
   wherein the transformer includes a central compensation capacitor coupled between a center tap of the secondary coil and ground, wherein the central compensation capacitor acts to suppress common-mode components in the differential signal;
   a pseudo-differential amplifier coupled to the input transformer, which converts the differential signal into a single-ended output signal, which has double the frequency of the single-ended input signal; and
   a frequency-doubler output, which outputs the single-ended output signal produced by the pseudo-differential amplifier.

2. The frequency doubler circuit of claim 1, wherein the central compensation capacitor is sized to ensure that the frequency doubler circuit provides a flat response over a target range of operating frequencies.

3. The frequency doubler circuit of claim 1, wherein the pseudo-differential amplifier doubles the frequency of the differential input signal by cancelling a fundamental frequency of the differential signal and extracting a second-order harmonic to produce the single-ended output signal.

4. The frequency doubler circuit of claim 3,
   wherein the differential signal comprises two complementary signals $S_1$ and $S_2$; and
   wherein the pseudo-differential amplifier is implemented using two transistors $M_1$ and $M_2$, wherein the gate of $M_1$ is coupled to $S_1$, wherein the gate of $M_2$ is coupled to $S_2$, wherein the drains of $M_1$ and $M_2$ are coupled to ground, and wherein the sources of $M_1$ and $M_2$ are combined at a common node, which is coupled to the frequency-doubler output through a set of output-matching elements.

5. The frequency doubler circuit of claim 4, further comprising a bias circuit, which provides a bias voltage for the gates of transistors $M_1$ and $M_2$, wherein the bias circuit includes:
   a bias input, which receives a bias voltage $V_b$;
   a bias bypass capacitor, coupled between the bias input and ground; and
   a conductor, which couples the bias input to the center tap of the secondary coil.

6. The frequency doubler circuit of claim 4, wherein the set of output-matching elements includes filtering elements, which filter out a fundamental frequency of the input signal, wherein the filtering elements include:
   a filtering inductor, with a first terminal coupled to the common node and a second terminal coupled to $V_{DD}$; and
   a filtering bypass capacitor, coupled between the second terminal of the filtering inductor and ground.

7. The frequency doubler of claim 4, wherein the set of output-matching elements includes impedance-matching elements, which match an impedance of the output signal with an impedance of an output load, wherein the impedance-matching elements include:
   an impedance-matching inductor, with a first terminal coupled to the common node; and
   an impedance-matching capacitor, coupled between a second terminal of the impedance-matching inductor and the frequency-doubler output.

8. The frequency doubler circuit of claim 4, further comprising:
   a first input-matching micro-strip transmission line $TL_1$, which carries the differential signal $S_1$ from the transformer to the gate of transistor $M_1$; and
   a second input-matching micro-strip transmission line $TL_2$, which carries the differential signal $S_2$ from the transformer to the gate of transistor $M_2$.

9. The frequency doubler circuit of claim 1, wherein the frequency doubler circuit is fabricated on a complementary metal oxide semiconductor (CMOS) chip.

10. A method for doubling a frequency of a single-ended signal, comprising:
    receiving the single-ended input signal;
    using a transformer-based balun to convert the single-ended input signal into a differential signal, wherein the transformer-based balun includes a transformer with a primary coil, which receives the single-ended input signal, and a secondary coil, which produces the differential signal, wherein the transformer includes a central compensation capacitor coupled between a center tap of the secondary coil and ground, wherein the central compensation capacitor acts to suppress common-mode components in the differential signal; and
    using a pseudo-differential amplifier to convert the differential signal into a single-ended output signal, which has double the frequency of the single-ended input signal.

11. The method of claim 10, wherein the central compensation capacitor is sized to ensure that the frequency doubler circuit provides a flat response over a target range of operating frequencies.

12. The method of claim 10, wherein the pseudo-differential amplifier doubles the frequency of the differential input signal by cancelling a fundamental frequency of the differential signal and extracting a second-order harmonic to produce the single-ended output signal.

13. The method of claim 12,
    wherein the differential signal comprises two complementary signals $S_1$ and $S_2$;
    wherein the pseudo-differential amplifier is implemented using two transistors $M_1$ and $M_2$, wherein the gate of $M_1$ is coupled to $S_1$, wherein the gate of $M_2$ is coupled to $S_2$, wherein the drains of $M_1$ and $M_2$ are coupled to ground, and wherein the sources of $M_1$ and $M_2$ are combined at a common node; and
    wherein the method further comprises using a set of output-matching elements to condition the frequency-doubler output.

14. The method of claim 13, further comprising using a bias circuit to provide a bias voltage for the gates of transistors $M_1$ and $M_2$, wherein the bias circuit includes:
    a bias input, which receives a bias voltage $V_b$;
    a bias bypass capacitor, coupled between the bias input and ground; and
    a conductor, which couples the bias input to the center tap of the secondary coil.

15. The method of claim 13, wherein the set of output-matching elements uses filtering elements to filter out a fundamental frequency of the input signal, wherein the filtering elements include:

a filtering inductor, with a first terminal coupled to the common node and a second terminal coupled to $V_{DD}$; and a filtering bypass capacitor, coupled between the second terminal of the filtering inductor and ground.

16. The method of claim 13, wherein the set of output-matching elements uses impedance-matching elements to match an impedance of the output signal with an impedance of an output load, wherein the impedance-matching elements include:

an impedance-matching inductor, with a first terminal coupled to the common node; and an impedance-matching capacitor, coupled between a second terminal of the impedance-matching inductor and the frequency-doubler output.

17. The method of claim 13, wherein the method further comprises:

using a first input-matching micro-strip transmission line $TL_1$ to carry the differential signal $S_1$ from the transformer to the gate of transistor $M_1$; and using a second input-matching micro-strip transmission line $TL_2$ to carry the differential signal $S_2$ from the transformer to the gate of transistor $M_2$.

18. The method of claim 10, wherein the method is performed using circuitry, which is fabricated on a complementary metal oxide semiconductor (CMOS) chip.

* * * * *